(12) United States Patent
Busby et al.

(10) Patent No.: US 9,769,965 B2
(45) Date of Patent: Sep. 19, 2017

(54) SINGLE-SIDED STICKY GASKET

(76) Inventors: Jeffrey D. Busby, Millsap, TX (US);
Michael D. Dry, Fort Worth, TX (US);
David R. Schmidt, Egg Harbor Township, NJ (US); Kent S. Boomer, Aledo, TX (US); Matthew J. Boyd, Fort Worth, TX (US); Douglas J. Smith, Weatherford, TX (US)

( * ) Notice: Subject to any disclaimer, the term of this patent is extended or adjusted under 35 U.S.C. 154(b) by 498 days.

(21) Appl. No.: 13/524,876

(22) Filed: Jun. 15, 2012

(65) Prior Publication Data
US 2013/0001894 A1    Jan. 3, 2013

Related U.S. Application Data

(60) Provisional application No. 61/498,185, filed on Jun. 17, 2011.

(51) Int. Cl.
*H05K 9/00* (2006.01)

(52) U.S. Cl.
CPC .................................. *H05K 9/0015* (2013.01)

(58) Field of Classification Search
CPC .................................................... H05K 9/0015
USPC .................................. 277/650–653, 312, 920
See application file for complete search history.

(56) References Cited

U.S. PATENT DOCUMENTS

| | | | |
|---|---|---|---|
| 214,083 A * | 4/1879 | Beardmore | 442/15 |
| 1,851,948 A | 3/1932 | Summers | |
| 2,092,393 A | 9/1937 | Hewitt | |
| 2,477,267 A * | 7/1949 | Robinson | 174/358 |
| 2,992,151 A * | 7/1961 | Niessen | 428/133 |
| 3,126,440 A | 3/1964 | Goodloe | |
| 3,230,290 A * | 1/1966 | Nelson et al. | 277/652 |
| 3,473,813 A | 10/1969 | Meyers | |
| 3,532,349 A | 10/1970 | Czernik | |
| 3,542,939 A | 11/1970 | Mintz | |
| 3,555,168 A | 1/1971 | Frykberg | |
| 3,681,272 A | 8/1972 | Gloskey | |
| 3,993,833 A | 11/1976 | Esmay | |
| 4,037,009 A * | 7/1977 | Severinsen | 442/1 |
| 4,090,988 A | 5/1978 | Babiec | |
| 4,180,211 A * | 12/1979 | Olcott et al. | 239/265.43 |
| 4,183,699 A | 1/1980 | Donan | |
| 4,325,280 A | 4/1982 | Hardy | |
| 4,544,169 A | 10/1985 | Cobb | |
| 4,635,949 A | 1/1987 | Lucas | |
| 4,657,807 A | 4/1987 | Fuerstman | |
| 4,835,060 A | 5/1989 | Kosiarski | |
| 4,865,905 A * | 9/1989 | Uken | 428/220 |

(Continued)

FOREIGN PATENT DOCUMENTS

| | | |
|---|---|---|
| JP | 09109346 A | 4/1997 |
| WO | WO 2005/030893 | 4/2005 |

OTHER PUBLICATIONS

"Conductive Elastomer Gasket Design," Chomerics, www.chomerics.com, pp. 1-9.

(Continued)

*Primary Examiner* — Eugene G Byrd
(74) *Attorney, Agent, or Firm* — Jackson Walker LLP

(57) ABSTRACT

Applicants disclose a gasket for use between a removable workpiece and a base. The gasket has a polyurethane body, is generally tabular, and on one side has a fabric skin attached thereto. On the non-skinned side, the body, typically polyurethane, is sticky to the touch.

15 Claims, 2 Drawing Sheets

(56) References Cited

U.S. PATENT DOCUMENTS

| | | | |
|---|---|---|---|
| 4,900,629 A | 2/1990 | Pitolaj | |
| 4,900,877 A | 2/1990 | Dubrow | |
| RE33,392 E | 10/1990 | Brauer | |
| 5,037,879 A | 8/1991 | Roberts | |
| 5,158,638 A | 10/1992 | Osanami | |
| 5,512,709 A | 4/1996 | Jencks et al. | |
| 5,702,111 A | 12/1997 | Smith | |
| 5,791,654 A | 8/1998 | Gaines et al. | |
| 5,890,719 A | 4/1999 | Bettencourt | |
| 5,910,524 A | 6/1999 | Kalinoski | |
| 5,929,138 A | 7/1999 | Mercer et al. | |
| 5,984,317 A * | 11/1999 | Grant-Acquah et al. | 277/592 |
| 6,056,526 A | 5/2000 | Sato | |
| 6,121,545 A | 9/2000 | Peng | |
| 6,346,330 B1 | 2/2002 | Huang et al. | |
| 6,364,976 B2 | 4/2002 | Fletemier | |
| 6,365,812 B1 | 4/2002 | McGill | |
| 6,403,226 B1 | 6/2002 | Biernath et al. | |
| 6,410,137 B1 | 6/2002 | Bunyan | |
| 6,454,267 B1 * | 9/2002 | Gaines et al. | 277/312 |
| 6,457,726 B1 * | 10/2002 | Jung | 277/611 |
| 6,530,577 B1 | 3/2003 | Busby | |
| 6,553,664 B1 | 4/2003 | Schenk | |
| 6,695,320 B2 | 2/2004 | Busby | |
| 6,717,047 B2 * | 4/2004 | Haselby et al. | 174/382 |
| 6,719,293 B1 * | 4/2004 | Coles et al. | 277/312 |
| 7,229,516 B2 | 6/2007 | Busby | |
| 7,290,769 B2 | 11/2007 | Plona | |
| 7,314,898 B2 | 1/2008 | Downing, Jr. et al. | |
| 7,455,301 B2 * | 11/2008 | Ragsdale et al. | 277/627 |
| 7,654,538 B2 | 2/2010 | Oka | |
| 8,066,843 B2 * | 11/2011 | Ragsdale et al. | 156/308.2 |
| 8,691,033 B1 * | 4/2014 | Busby et al. | 156/71 |
| 2002/0135137 A1 | 9/2002 | Hammi | |
| 2004/0041356 A1 | 3/2004 | Smith et al. | |
| 2004/0070156 A1 | 4/2004 | Smith | |
| 2005/0023768 A1 | 2/2005 | Adams | |
| 2006/0194488 A1 | 8/2006 | Coghill | |
| 2009/0322040 A1 | 12/2009 | Banba | |
| 2010/0258200 A1 | 10/2010 | Walker | |
| 2011/0156353 A1 | 6/2011 | Kabutoya et al. | |
| 2013/0273342 A1 | 10/2013 | Johnson et al. | |
| 2014/0334868 A1 | 11/2014 | Apfel | |

OTHER PUBLICATIONS

"Technical Data Sheet," PNE 1500101130CR, VTT/Shieldex Trading USA, www.shieldextrading.net/product_INDEX.html.
Tecknit, EMI Shielding Products, Mesh & Elastomer Combination Gaskets, www.tecknit.com/meshelas.html.
Tecknit, EMI Shielding Products, Oriented Wire Mesh Strip & Gasket Material, www.tecknit.com/orient.html.
Tecknit, EMI Shielding Products, Conductive Silicone Elastomers, www.tecknit.com/silelast.html.
Loos & Co., Inc., Knitted Wire Mesh, www.loosco.com/index.php?page=knitted-wire-mesh, 3 pages Dec. 7, 2012.
Extended European Search Report, Application No. 12800194.8-1803 / 2721914; PCT/US2012042742, 8 pages dated Jun. 24, 2015.

* cited by examiner

SINGLE-SIDED STICKY GASKET

This utility application claims benefit of and priority, and incorporates hereby by reference, U.S. Provisional Patent Application Ser. No. 61/498,185, filed Jun. 17, 2011.

FIELD OF THE INVENTION

Gaskets, more particularly, an elastomeric gasket with a single sticky side and a non-sticky side.

BACKGROUND OF THE INVENTION

Gaskets maintain an environmental seal typically between a workpiece and a base. Gaskets typically provide some adhesion between a workpiece on the one side and the base on the other. Some gaskets may be, at least in part, elastomeric and compressible.

Sometimes gaskets are provided for EMI shielding (to reduce electrical interference) and to provide a low electrical resistance path between the workpiece and the base.

SUMMARY OF THE INVENTION

Applicants provide a gasket having a sticky or tacky (to the touch) flexible or elastomeric, resilient body. The body has an upper surface which contacts an upper skin, a fabric, typically woven, non-sticky (to the touch and to the removable workpiece) and at least partly permeable (to the body when under compression), and a lower or second surface that is uncoated and uncovered. The upper skin adheres to the upper surface of the body but is generally non-tacky with respect to a removable workpiece and/or static base structure, which structure and workpiece will receive a gasket, typically under compression, therebetween. The body of the gasket may include a flexible skeleton or other flexible member substantially enclosed within the body.

DETAILED DESCRIPTION OF THE PREFERRED EMBODIMENT

Figure 1:
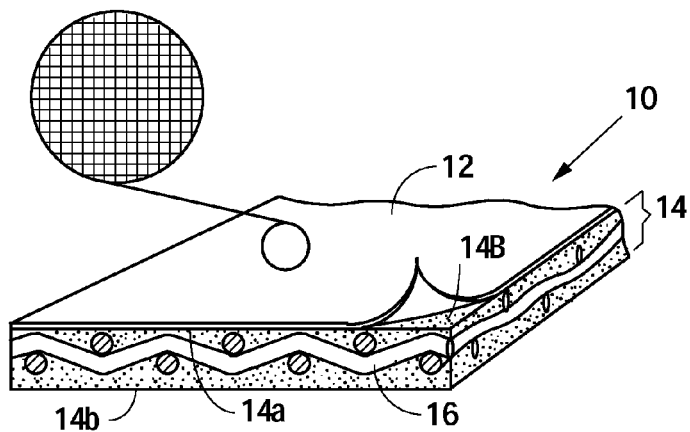
FIG. 1 is a perspective view of an embodiment of Applicant's gasket (non-compressed).
Figure 2:
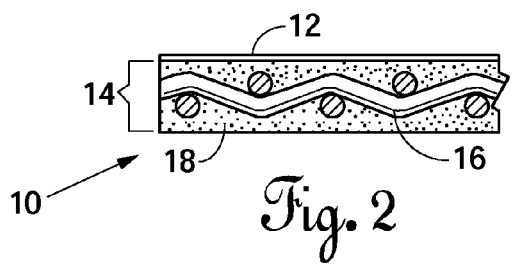
FIG. 2 is an illustration of an embodiment of Applicant's gasket in elevational cross-sectional view.

Applicant provides a gasket 10, typically tabular in nature and usually having a substantially greater length and width than thickness. One of the novel properties of Applicant's gasket 10 is its ability to adhere better to a first surface (or a base) then to a second surface (or a workpiece). The second surface or workpiece may be easily removed multiple times from the gasket 10 after it has been attached thereto for a period of time but which removal does not dislodge the gasket from the base. An embodiment of Applicant's novel gasket 10 has a sticky first side and a second side that is less sticky, the gasket for use between a workpiece which may be removably attached to a typically-static base, wherein the workpiece is typically against the non-sticky side and the base against the sticky side.

Turning to the figures, it is seen that Applicant provides a gasket 10 having upper skin 12 thereon. The upper skin 12 adheres to a sticky elastomeric body 14, the body 14 typically having a skeleton 16 substantially encapsulated therein. In one embodiment, body 14 includes a flexible woven skeleton and an elastomer 18, which elastomer may have certain properties selected for adherence or stickiness to a base. The upper skin may have properties which allow it to stick to the elastomer 18 of body 14 on a first side but provide also for non-stickably receiving a workpiece on the other side thereof. The workpiece and base are typically metallic, for example, aluminum.

In one form of Applicant's single-sided sticky gasket 10, elastomer 18 may be a cured polyurethane and upper skin 12 may be an electronically conductive fabric backing. In this embodiment, gasket 10 may include a wire mesh as the skeleton 16 and may be particularly useful where a low electrical resistance path is required.

In a preferred embodiment, the mesh frame or skeleton 16 may be 5056 aluminum alloy or other suitable metal, and the thickness of the gasket before compression (between the workpiece and the base) may be about 30 mil, after compression about 20-22 mil. A preferred range of total gasket thickness (with upper skin) is about 20-50 mil. Under compression between a workpiece and a base, it may be compressed by at least about 10 mil, typical compression to about 60-80% of original thickness. Such compression will typically yield sufficient seepage of body (including a cured polyurethane body) between the individual fibers of a woven metalized fiber (see FIGS. 6A and 6B). Sufficient seepage will assist in environmental sealing between the workpiece and the gasket.

With reduced tack on the skin side of gasket 10, a workpiece can usually be easily removed and re-installed without damaging or repositioning on the gasket base. Moreover, since the elastomer 18 may be, in a preferred embodiment, pre-cured before installation, elimination of cure time is achieved.

Use of a polyurethane material as elastomer 18 will leave no silicon oil residue before, during, or after installation or removal, and no other problems that silicon leeching may generate. The polyurethane body material is disclosed in U.S. Pat. Nos. 6,530,517; 6,695,320; and 7,229,516, incorporated herein by reference. The Avdec grey or blue polymer, available from Avdec, Forth Worth, Tex., is suitable (www.avdec.com).

The polyurethane body material used typically will maintain a good seal during vibration, pressure, and thermal cycling. In a preferred embodiment, elastomer 18 and upper skin 12 will maintain physical or chemical properties over a significant temperature range. For example, −65° centigrade to 90° centigrade.

Figure 3:
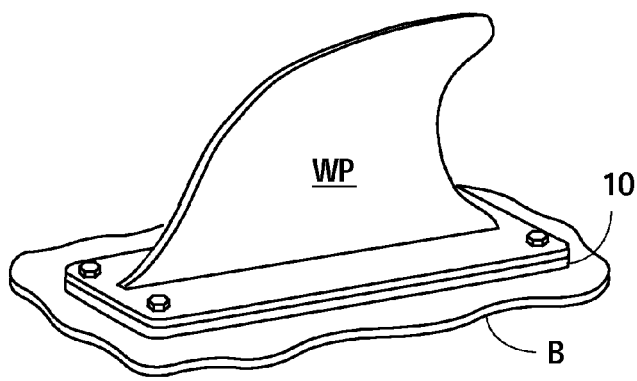
FIGS. 3 and 4 are side, cutaway views of an embodiment of Applicant's gasket under compression between a workpiece and a base.
Figure 4:
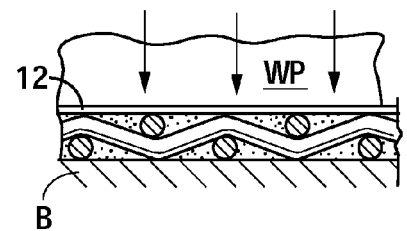

FIGS. 3 and 4 illustrate the characteristics of Applicant's novel single-sided sticky gasket 10 under compression between a workpiece WP and a base. Arrows in the figures illustrate the compressional forces, which may be achieved by the use of threaded fasteners (not shown) between the workpiece and the base. It is seen that, under compression, the thickness of the gasket 10 is reduced and skeleton 16, especially when the skeleton is at least partly metallic substance (including metalized fabric), may provide low resistivity (high electrical conductivity) between the workpiece and the base. Furthermore, when low resistivity is required, upper skin 12 will typically be comprised of a highly conductive yet flexible fabric, with galvanic compatibility (to aluminum in one embodiment) that will avoid breakdown or corrosion of a metallic workpiece and base as a result of small electric currents therebetween. Various workpiece (removable)/base (static) combinations from aircraft environment include: doors and door panels; floor panels and stringers; wall panels and frame members; antenna and outer skin.

Figure 6B:
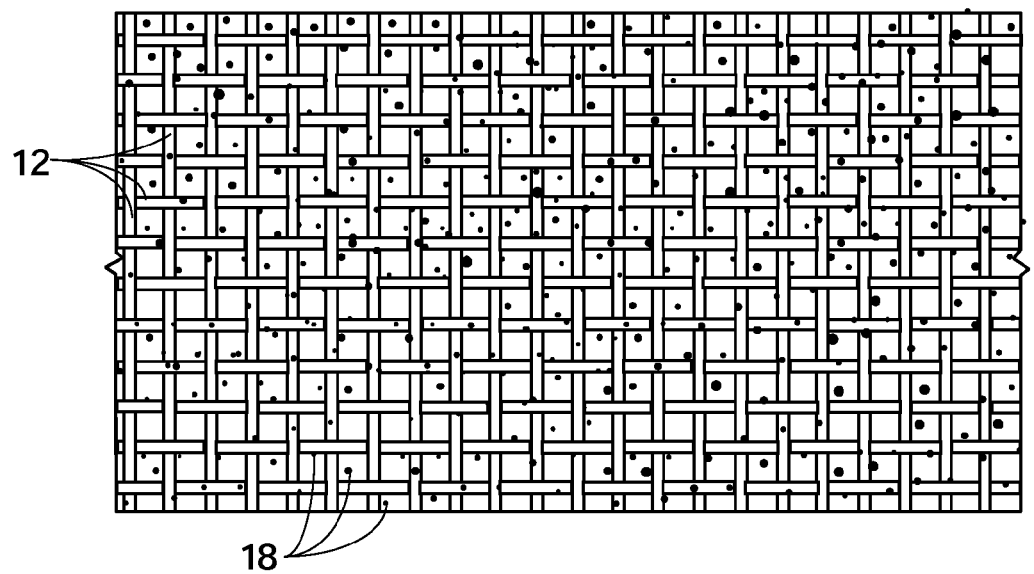
FIGS. 6A and 6B are detail views, top elevational and cross-sectional, showing seepage of the gasket elastomer through the skin after a period of compression.
Figure 6A:
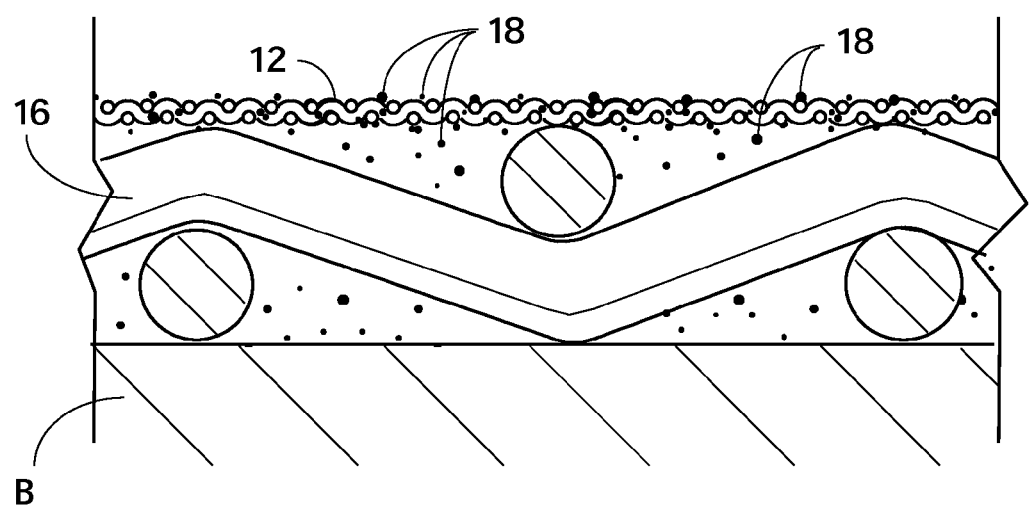

One such material that has proven effective for upper skin 12 when EMI shielding is desired is Zell-CR, a Shieldex fabric available from Shieldex Trading U.S., Palmyra, N.Y., www.shieldextrading.net. The skin may be woven, as seen in FIGS. 6A and 6B; may be metallic in a preferred embodiment, or non-metallic; may be a mesh, metalized cloth or fabric or any other suitable material. One material that may be useful as a pre-cured, elastomeric body is polyurethane Grey (U-1016/T-1017) available from AvDec, Fort Worth, Tex. The gasket with the skin adhered to one surface may be die cut or provided as a tape. One suitable elastomeric material may be provided by AvDec, Fort Worth, Tex., as Part No. AD2740X-YY-CZ.

Figure 5:
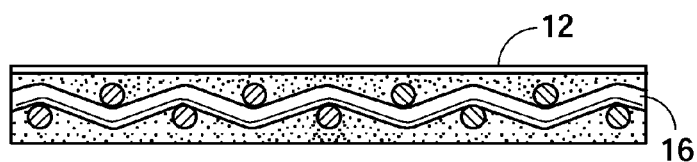
FIG. 5 is a side cross-sectional view (non-compressed) of an embodiment of Applicants' gasket.

In FIG. 5 it is seen that a preferred embodiment of Applicant's invention may have the skeleton in the form of a wire mesh frame, which is substantially enclosed in a polyurethane body such as provided by AvDec part No. AD2740X-YY-CZ, where the wire mesh frame is 5056 aluminum mesh or other suitable electrically conductive skeleton. The 5056 aluminum may be 40×40 per square inch. Where the outer skin is an electrically conductive flexible fabric backing, such as that available from Shieldex as Zell-CR in thickness of about 0.0045 mil. The range of skin thickness is, preferred, about 3 mil to about 10 mil; the range of body thickness about 20 mil to 60 mil (uncompressed). The pre-compression gasket thickness is preferably about 30 mil. This gasket will provide EMI shielding and a low resistance electrical path. Bonding resistance is typically less than about 2.5 milliohm. A metalized fabric, such as Zell-CR, in a thickness of about 0.0045" has EMI shielding characteristics. This is a conductive metalized nylon fabric, which has a very high conductivity, and consists of a tin/nickel mix silver plated applied on a nylon rib stock fabric. It is typically used as a clean room coating and is clean room compatible. The surface resistance is less than 0.002 ohms. The shielding effectiveness averages 90 db from 30 Mhz to 10 Ghz. The temperature range is −30° C. to 90° C. and the total thickness is 0.0045" nominal. It is extremely flexible, partly permeable to the polyurethane body under compression, and highly protected from galvanic corrosion.

FIGS. 6A and 6B illustrate some seepage or migration of polyurethane gel (Avdec Grey indicated by speckling) through the Shieldex Zell-CR skin after about three hours under compression (about 250 psi clamping force). The gasket was in a chamber under 85° C. to "accelerate" the effects of compression and distortion and seepage. What is seen is consistent with two weeks under similar, but no heat, conditions. Substantial electrical conductivity and removability is maintained, even with seepage between 20-80% surface coverage estimated, by close visual examination and a partly sticky touch.

Although the invention has been described with reference to a specific embodiment, this description is not meant to be construed in a limiting sense. On the contrary, various modifications of the disclosed embodiments will become apparent to those skilled in the art upon reference to the description of the invention. It is therefore contemplated that the appended claims will cover such modifications, alternatives, and equivalents that fall within the true spirit and scope of the invention.

The invention claimed is:

1. A gasket comprising: a cured, sticky, elastomeric polyurethane body having a metallic skeleton, the body having an upper surface and a lower surface; and an electrically conductive skin on one of the upper surface or the lower surface, the electrically conductive skin forming a first gasket surface, the other of the upper surface or lower surface forming a second gasket surface; wherein the gasket, under compression, allows some seepage of the polyurethane of the polyurethane body through the electrically conductive skin, and wherein the electrically conductive skin has polyurethane dispersed therein.

2. The gasket of claim 1, wherein the electrically conductive skin is in contact with the metallic skeleton of the polyurethane body.

3. The gasket of claim 1, wherein the polyurethane body is generally tabular.

4. The gasket of claim 1, wherein the electrically conductive skin is a woven, metallized fabric.

5. The gasket of claim 1, wherein the polyurethane body has a hardness in the range of about 75 to 150 (measured with a 37.5 gram half cone penetrometer).

6. The gasket of claim 1, wherein the resistance of the electrically conductive skin is about 0.002 ohms per unit square.

7. The gasket of claim 1, wherein the electrically conductive skin is capable of maintaining electrical conductivity when under compression.

8. The gasket of claim 1, wherein the electrically conductive skin has a non-metallic woven fabric substrate.

9. The gasket of claim 8, wherein the non-metallic woven fabric substrate is ripstop nylon.

10. The gasket of claim 1, wherein the polyurethane body is between about 20 and 60 mil thick and the electrically conductive skin is between about 3 and 10 mil thick.

11. A gasket comprising: a cured, sticky, elastomeric polyurethane body having a metallic skeleton, the body having an upper surface and a lower surface; and an electrically conductive skin on one of the upper surface or the lower surface, the electrically conductive skin forming a first gasket surface, the other of the upper surface or lower surface forming a second gasket surface; wherein the gasket, under compression, allows some seepage of the polyurethane of the polyurethane body through the electrically conductive skin; wherein the electrically conductive skin has polyurethane dispersed therein; wherein the electrically conductive skin is in contact with the metallic skeleton of the polyurethane body; wherein the polyurethane body has a hardness in the range of about 75 to 150 (measured with a 37.5 gram half cone penetrometer); wherein the resistance of the electrically conductive skin is about 0.002 ohms per unit square; and wherein the polyurethane body is between about 20 and 60 mil thick and the electrically conductive skin is between about 3 and 10 mil thick.

12. An assembly for use with an aircraft body, the assembly comprising: a removable workpiece; a static base; a gasket for placement between the removable workpiece and the static base, the gasket being a gasket as claimed in claim 1; and fasteners for compressing the gasket between the removable workpiece and the static base.

13. The assembly in claim 11, wherein the removable workpiece is an aircraft antenna and the static base is the aircraft body fuselage.

14. The assembly in claim 12, wherein the gasket has a pre-compression thickness of between about 20 and 60 mil and a post-compression thickness of between about 60 and 80% of its original thickness.

15. The assembly of claim 12, wherein the skin is an at least partly metallic fabric; wherein the at least partly metallic fabric is woven; wherein the skin is adapted to allow some seepage of elastomer therethrough, and wherein the body is generally tabular.

\* \* \* \* \*